(12) United States Patent
Feng et al.

(10) Patent No.: US 10,483,129 B2
(45) Date of Patent: Nov. 19, 2019

(54) METHOD FOR ROUGHENING THE SURFACE OF A METAL LAYER, THIN FILM TRANSISTOR, AND METHOD FOR FABRICATING THE SAME

(71) Applicant: BOE Technology Group Co., Ltd., Beijing (CN)

(72) Inventors: Jing Feng, Beijing (CN); Seung Jin Choi, Beijing (CN); Fangzhen Zhang, Beijing (CN); Wusheng Li, Beijing (CN); Zhijun Lv, Beijing (CN); Ce Ning, Beijing (CN); Jiushi Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 42 days.

(21) Appl. No.: 15/717,527

(22) Filed: Sep. 27, 2017

(65) Prior Publication Data

US 2018/0226269 A1    Aug. 9, 2018

(30) Foreign Application Priority Data

Feb. 9, 2017 (CN) .......................... 2017 1 0071436

(51) Int. Cl.
*H01L 21/4763* (2006.01)
*H01L 21/027* (2006.01)
(Continued)

(52) U.S. Cl.
CPC ...... *H01L 21/47635* (2013.01); *G03F 7/0035* (2013.01); *G03F 7/20* (2013.01);
(Continued)

(58) Field of Classification Search
CPC ......... H01L 21/47635; H01L 29/66969; H01L 27/1225; H01L 29/78618; H01L 29/7869;
(Continued)

(56) References Cited

U.S. PATENT DOCUMENTS 5,770,523 A * 6/1998 Hung ........................ G03F 7/42
134/1.2
6,423,650 B2 * 7/2002 Plat ...................... H01L 21/0271
257/E21.024
(Continued)

FOREIGN PATENT DOCUMENTS

| CN | 1652350 | 8/2005 |
|---|---|---|
| CN | 103660575 | 3/2014 |

OTHER PUBLICATIONS

State Intellectual Property Office of People's Republic of China, "First Office Action," issued in connection with Chinese Patent Application No. 201710071436.3, dated Dec. 12, 2018, 17 pages.

*Primary Examiner* — William F Kraig
*Assistant Examiner* — Vicki B. Booker
(74) *Attorney, Agent, or Firm* — Arent Fox LLP; Michael Fainberg

(57) ABSTRACT

The disclosure discloses a method for roughening a surface of a metal layer, a thin film transistor, and a method for fabricating the same. The method for roughening the surface of a metal layer includes: forming a first photo-resist layer on the surface of the metal layer, and processing the first photo-resist layer at high temperature; and stripping the first photo-resist layer to roughen the surface of the metal layer.

6 Claims, 5 Drawing Sheets

(51) Int. Cl.

| | |
|---|---|
| *H01L 29/66* | (2006.01) |
| *H01L 29/786* | (2006.01) |
| *G03F 7/00* | (2006.01) |
| *H01L 27/12* | (2006.01) |
| *G03F 7/38* | (2006.01) |
| *G03F 7/20* | (2006.01) |
| *G03F 7/40* | (2006.01) |
| *H01L 21/321* | (2006.01) |

(52) U.S. Cl.
CPC .............. *G03F 7/38* (2013.01); *G03F 7/40* (2013.01); *H01L 21/0274* (2013.01); *H01L 21/321* (2013.01); *H01L 27/1225* (2013.01); *H01L 27/1288* (2013.01); *H01L 29/66969* (2013.01); *H01L 29/7869* (2013.01); *H01L 29/78618* (2013.01)

(58) Field of Classification Search
CPC . H01L 21/0274; H01L 27/1288; H01L 21/44; H01L 21/461; H01L 21/463; H01L 21/469; H01L 21/471; H01L 21/473; H01L 21/4763; H01L 21/28; H01L 29/7393; H01L 29/7394; H01L 29/458; H01L 29/772; H01L 29/78; H01L 29/786; H01L 21/0273; H01L 27/1262; G03F 7/40; G03F 7/20; G03F 7/38; G03F 7/0035; G03F 7/42; G03F 7/422; G03F 7/427; G03F 7/428; G03F 7/26; G03F 7/004

See application file for complete search history.

(56) References Cited

U.S. PATENT DOCUMENTS

| | | | | |
|---|---|---|---|---|
| 2002/0079501 | A1* | 6/2002 | Okada | G02F 1/1362 257/88 |
| 2005/0110011 | A1* | 5/2005 | Im | H01L 27/1248 257/40 |
| 2010/0093122 | A1* | 4/2010 | Min | H01L 21/0272 438/30 |
| 2012/0313096 | A1* | 12/2012 | Kim | H01L 21/0237 257/57 |
| 2014/0085380 | A1 | 3/2014 | Uno | |
| 2016/0013294 | A1* | 1/2016 | Hou | H01L 27/1288 257/66 |

* cited by examiner

METHOD FOR ROUGHENING THE SURFACE OF A METAL LAYER, THIN FILM TRANSISTOR, AND METHOD FOR FABRICATING THE SAME

CROSS-REFERENCE TO RELATED APPLICATIONS

This application claims the priority to Chinese Patent Application No. 201710071436.3, filed on Feb. 9, 2017, the content of which is hereby incorporated by reference in its entirety.

FIELD

The present disclosure relates to the field of display technologies, and particularly to a method for roughening the surface of a metal layer, a thin film transistor, and a method for fabricating the same.

BACKGROUND

A metal layer is etched in the prior art by applying photo-resist on the metal layer, exposing, developing, and ashing the photo-resist using a mask, and then etching the metal layer, where the photo-resist tends to peel off due to poor adhesion between the surface of the metal layer and the photo-resist, so that a pattern on the metal layer may be damaged if the metal layer is etched.

Accordingly, how to avoid the photo-resist applied to the surface of the metal layer from peeling off is a technical problem highly desirable to be addressed.

SUMMARY

In view of this, the disclosure provides a method for roughening the surface of a metal layer, a thin film transistor, and a method for fabricating the same.

An embodiment of the disclosure provides a method for roughening the surface of a metal layer, the method including:

forming a first photo-resist layer on the surface of the metal layer, and processing the first photo-resist layer at high temperature; and stripping the first photo-resist layer to roughen the surface of the metal layer.

Correspondingly an embodiment of the disclosure further provides a method for fabricating a thin film transistor, the method including:

forming an oxide semiconductor layer and a source-drain metal layer on an underlying substrate;

forming a first photo-resist layer on a surface of the source-drain metal layer, and processing the first photo-resist layer at high temperature; and stripping the first photo-resist layer to roughen the surface of the source-drain metal layer; and performing a patterning process on the roughened source-drain metal layer, and the oxide semiconductor layer to form patterns of source and drain electrodes, and a pattern of an active layer.

Correspondingly an embodiment of the disclosure further provides a thin film transistor including the thin film transistor fabricated using the method for fabricating a thin film transistor according to any one of the implementations of the embodiment of the disclosure.

Correspondingly an embodiment of the disclosure further provides an array substrate including the thin film transistor above according to the embodiment of the disclosure.

DETAILED DESCRIPTION OF THE EMBODIMENTS

Figure 1:
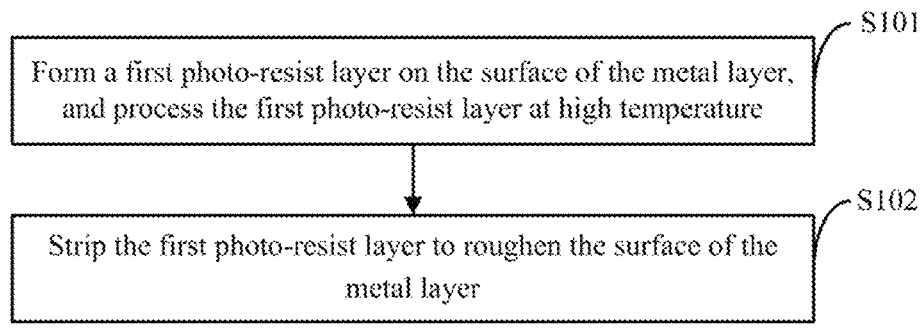
FIG. 1 is a schematic flow chart of a method for roughening the surface of a metal layer according to an embodiment of the disclosure.

In order to make the objects, the technical solutions and the advantages of the disclosure more apparent, the disclosure will be further described in details with reference to the drawings. Apparently the described embodiments are only a part but all of the embodiments of the disclosure. Based upon the embodiments of the disclosure here, all of other embodiments derived by those ordinarily skilled in the art without any inventive effort shall come into the scope of the disclosure.

The disclosure provides a method for roughening the surface of a metal layer, a thin film transistor, and a method for fabricating the same, where the surface of the metal layer is roughened so that the surface of the metal layer is rough, thereby improving the adhesion to the metal layer while the surface of the metal layer is being patterned later.

Particular implementations of a thin film transistor, a method for fabricating the same, and an array substrate according to embodiments of the disclosure will be described below in details with reference to the drawings. The thicknesses and shapes of respective film layers in the drawings are not intended to reflect any real proportion, but only intended to illustrate the content of the disclosure.

Referring to FIG. 1, a method for roughening the surface of a metal layer according to an embodiment of the disclosure includes the following steps.

The step S101 is to form a first photo-resist layer on the surface of the metal layer, and to process the first photo-resist layer at high temperature; and The step S102 is to strip the first photo-resist layer to roughen the surface of the metal layer.

A method for roughening the surface of a metal layer according to an embodiment of the disclosure includes: forming a first photo-resist layer on the surface of the metal layer, and processing the first photo-resist layer at high temperature; and stripping the first photo-resist layer to roughen the surface of the metal layer. In the embodiment of the disclosure, the photo-resist layer is processed at high temperature so that the first photo-resist layer will not easily peel off while being striped, thus improving the roughness of the surface of the metal layer, and in this way, the photo-resist will not easily peel off the metal layer being etched. Accordingly in the embodiment of the disclosure, the photo-resist layer is processed at high temperature so that the roughness of the surface of the metal layer will be improved while the photo-resist layer is being striped, thus improving the adhesion to the surface of the metal layer while the surface of the metal layer is being patterned later.

In a particular embodiment, in the method above for roughening the surface of a metal layer according to the embodiment of the disclosure, the first photo-resist layer is processed at high temperature in the step S101 by pre-baking, exposing, developing, and post-baking the first photo-resist layer. Particularly the entire surface of the metal layer is coated with the first photo-resist layer, the first photo-resist layer is pre-baked, exposed, developed, and post-baked, and the first photo-resist layer is striped directly, so that the first photo-resist layer is striped at high temperature of post-baking to roughen the surface of the metal layer, thus improving the adhesion to the surface of the metal layer while the surface of the metal layer is being patterned later.

In a particular embodiment, in the method above for roughening the surface of a metal layer according to the embodiment of the disclosure, the temperature of post-baking ranges from 110° C. to 150° C. The temperature of post-baking may not be too high to avoid the photo-resist from being melted, and the temperature of post-baking may not be too low to maintain the adhesion between the photo-resist layer and the surface of the metal layer. Optionally the temperature of post-baking may be controlled between 110° C. and 150° C., and will not be limited thereto, but can be controlled as needed in operation. Furthermore the photo-resist layer may be post-baked for a period of time controllable according to the real size of the metal layer, and optionally ranging from 100 s to 200 s.

A thin film transistor is typically fabricated with a source-drain metal layer typically consisted of two layers MoNb/Cu or three layers MoNb/Cu/MoNb, and if the source-drain metal layer is structured in three layers, then MoNb in close contact with photo-resist may be poorly adhered to the photo-resist so that the photo-resist above the source-drain metal layer may easily peel off; and when etching the source-drain metal layer, the source-drain metal layer corresponding to patterns of source and drain electrodes may be easily etched so that the surface of Cu may be oxidized in subsequent plasmas treatment. Accordingly if the metal layer of the source-drain metal layer is structured in three layers MoNb/Cu/MoNb, then the photo-resist may be poorly adhered to the surface of MoNb so that the photo-resist may peel in a subsequent process of etching Cu.

Figure 2:
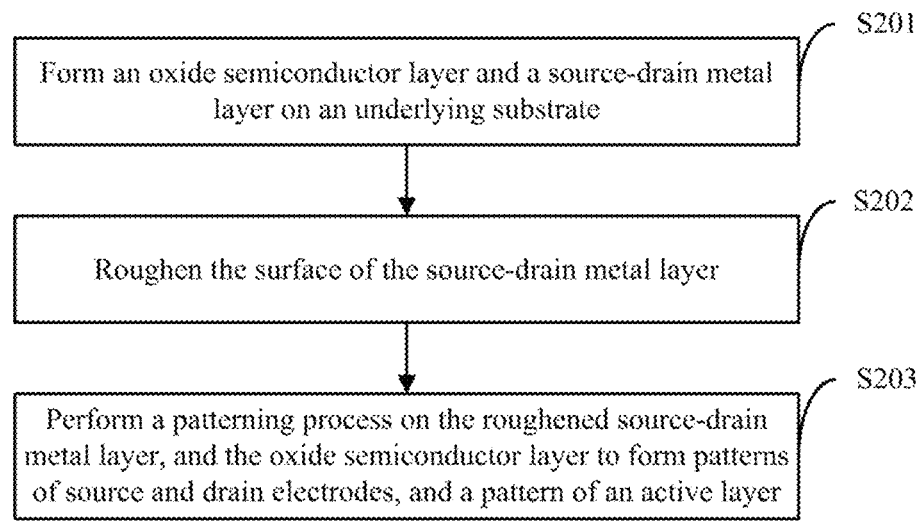
FIG. 2 is a schematic flow chart of a method for fabricating a thin film transistor according to an embodiment of the disclosure.

In view of this, based upon the same inventive idea, referring to FIG. 2, a method for fabricating a thin film transistor according to another embodiment of the disclosure includes the following steps.

The step S201 is to form an oxide semiconductor layer and a source-drain metal layer on an underlying substrate.

Where the thin film transistor according to the embodiment of the disclosure can be structured with a top gate or a bottom gate. For the thin film transistor structured with a bottom gate, patterns of the gate and a gate insulation layer may be further formed on the underlying substrate before a pattern of the oxide semiconductor layer is formed on the underlying substrate.

The step S202 is to roughen the surface of the source-drain metal layer using the method above for roughening the surface of a metal layer according to any one of the embodiments of the disclosure; and The step S203 is to perform a patterning process on the roughened source-drain metal layer, and the oxide semiconductor layer to form patterns of source and drain electrodes, and a pattern of an active layer.

Where the patterning process may include only a photolithography process or may include a photolithography process and an etching step, and also other processes for forming a predetermined pattern, such as printing and ink-jetting; and the photolithography process refers to a process, including film formation, exposure, development, etc., for forming a pattern using photo-resist, a mask, an exposure machine, etc. In a particular implementation, the corresponding patterning process can be selected according to the structure to be formed in the embodiment of the disclosure.

A method for fabricating a thin film transistor according to an embodiment of the disclosure includes: forming an oxide semiconductor layer and a source-drain metal layer on an underlying substrate; roughening the surface of the source-drain metal layer; and performing a patterning process on the roughened source-drain metal layer, and the oxide semiconductor layer to form patterns of source and drain electrodes, and a pattern of an active layer. Accordingly in the embodiment of the disclosure, after the surface of the source-drain metal layer is roughened, the adhesion to the surface of the source-drain metal layer is improved, and then the source-drain metal layer is patterned in the patterning process by coating it with the photo-resist, thus avoiding the photo-resist from peeling off.

In a particular embodiment, in the fabricating method above according to the embodiment of the disclosure, the surface of the source-drain metal layer is roughened in the step S202 by: forming a first photo-resist layer on the source-drain metal layer; pre-baking, exposing, developing, and post-baking the first photo-resist layer; and stripping the first photo-resist layer. Particularly before the source-drain metal layer and the oxide semiconductor layer are patterned using a patterning process, the entire surface of the source-drain metal layer is coated with the first photo-resist layer, the first photo-resist layer is pre-baked, exposed, developed, and post-baked, and the first photo-resist layer is striped directly, so that the first photo-resist layer is striped at high temperature of post-baking to roughen the surface of the source-drain metal layer, thus improving the adhesion to the surface of the source-drain metal layer while the surface of the source-drain metal layer is being patterned later.

Particularly the surface of the source-drain metal layer is rinsed before it is coated with the first photo-resist layer.

In a particular embodiment, in the fabricating method above according to the embodiment of the disclosure, the patterning process is performed on the roughened source-drain metal layer, and the oxide semiconductor layer to form the patterns of the source and drain electrodes, and the pattern of the active layer by: forming a second photo-resist layer on the roughened source-drain metal layer; exposing and developing the second photo-resist layer to form an area where all the second photo-resist is reserved, an area where all the second photo-resist is removed, and an area where a part of the second photo-resist is reserved, where the area where a part of the second photo-resist is reserved corresponds to a channel area, and the area where all the second photo-resist is reserved corresponds to the patterns of the source and drain electrodes to be formed; etching the source-drain metal layer, and the oxide semiconductor layer, corresponding to the area where all the second photo-resist is removed, to form the pattern of the active layer; ashing the second photo-resist layer to remove the area where a part of the second photo-resist is reserved; and etching the source-drain metal layer corresponding to the area where a part of the second photo-resist is reserved, to form the patterns of the source and drain electrodes.

Particularly the roughened source-drain metal layer is further rinsed before the second photo-resist layer is formed on the source-drain metal layer. Then the entire surface of the source-drain metal layer is coated with the second photo-resist layer, and the second photo-resist layer outside the area of the thin film transistor is removed through process of exposure and development, all the area corresponding to the patterns of the source and drain electrodes is reserved, and a part of the second photo-resist corresponding to the channel area is reserved, where the channel area refers to an area between a source electrode and a drain electrode after the patterns of the source and drain electrodes are formed.

In a particular embodiment, in the fabricating method above according to the embodiment of the disclosure, the method further includes: post-baking the developed second photo-resist layer after the second photo-resist layer is developed, and before the source-drain metal layer is etched. Particularly in order to avoid the photo-resist from peeling off in the area where a part of the second photo-resist is reserved, and the area where all the second photo-resist is reserved, before the source-drain metal layer corresponding to the area where all the second photo-resist is removed is etched, the step of post-baking is further performed to further improve the adhesion between the second photo-resist layer and the surface of the source-drain metal layer.

In a particular embodiment, in the fabricating method above according to the embodiment of the disclosure, after the second photo-resist layer is ashed, and before the source-drain metal layer corresponding to the area where a part of the second photo-resist is reserved, the method further includes: post-backing the ashed second photo-resist layer. Particularly in order to avoid the photo-resist layer from peeling off in the area where all the second photo-resist is reserved, before the source-drain metal layer corresponding to the area where a part of the second photo-resist is reserved is etched, the step of post-baking is further performed to further improve the adhesion between the second photo-resist layer, and the surface of the source-drain metal layer.

In a particular embodiment, in the fabricating method above according to the embodiment of the disclosure, the temperature of post-baking ranges from 110° C. to 150° C. The temperature of post-baking may not be too high to avoid the photo-resist from being melted, and the temperature of post-baking may not be too low to maintain the adhesion between the photo-resist layer and the surface of the source-drain metal layer. Optionally the temperature of post-baking may be controlled between 110° C. and 150° C., and will not be limited thereto, but can be controlled as needed in operation. Furthermore the photo-resist layer may be post-baked for a period of time controllable according to the real size of the metal layer, and optionally ranging from 100 s to 200 s.

In a particular embodiment, in the fabricating method above according to the embodiment of the disclosure, the source-drain metal layer and the oxide semiconductor layer corresponding to the area where all the second photo-resist is removed are over-etched for a period of time which is 5% to 20% of the length of time for which all the source-drain metal layer and the oxide semiconductor layer corresponding to the area where all the second photo-resist is removed are etched.

Particularly when the source-drain metal layer corresponding to the area where all the second photo-resist is removed is etched, all the source-drain metal layer and the oxide semiconductor layer corresponding to the area where all the second photo-resist is removed are etched for a length m of time, and in order to further etch all the source-drain metal layer corresponding to the area where all the second photo-resist is removed, it needs to be over-etched for a period of time in the fabrication process to thereby etch all of what are redundant. Accordingly the over-etched period of time in the embodiment of the disclosure refers to an additional length of etching time after all the film layer to be etched is etched. Furthermore in order to avoid it from being over-etched for a too large length of time, which would otherwise cause the source-drain electrode layer from being broken, or the photo-resist to peel off, optionally the over-etched period of time applied is 5% to 20% of the length of time for which all the source-drain metal layer corresponding to the area where all the second photo-resist is removed is etched. Alike the oxide semiconductor layer below the source-drain metal layer is over-etched for a period of time which is 5% to 20% of the length of time for which all the oxide semiconductor layer corresponding to the area where all the second photo-resist is removed is etched.

In a particular embodiment, in the fabricating method above according to the embodiment of the disclosure, the source-drain metal layer corresponding to the area where a part of the second photo-resist is reserved is over-etched for a period of time which is 0% to 20% of the length of time for which all the source-drain metal layer corresponding to the area where a part of the second photo-resist is reserved is etched.

Particularly when the source-drain metal layer corresponding to the area where a part of the second photo-resist is reserved is etched, all the source-drain metal layer corresponding to the area where a part of the second photo-resist is reserved is etched for a length n of time, and in order to further etch all the source-drain metal layer corresponding to the area where a part of the second photo-resist is reserved, it needs to be over-etched in the fabrication process to thereby etch all of what are redundant. Accordingly the over-etched period of time in the embodiment of the disclosure refers to an additional length of etching time after all the film layer to be etched is etched. Furthermore in order to avoid it from being over-etched for a too large length of time, which would otherwise cause the source-drain electrode layer from being broken, or the photo-resist to peel off, optionally the source-drain metal layer corresponding to the area where a part of the second photo-resist is reserved may not be over-etched, that is, the over-etched period of time applied is 0% of the length of time for which all the source-drain metal layer corresponding to the area where a part of the second photo-resist is reserved is etched; or the source-drain metal layer corresponding to the area where a part of the second photo-resist is reserved may be over-etched for a period of time which is shorter than 20% of the length of time for which all the source-drain metal layer corresponding to the area where a part of the second photo-resist is reserved is etched.

In a particular embodiment, in the fabricating method above according to the embodiment of the disclosure, after the patterns of the source and drain electrodes are formed, the method further includes: stripping the second photo-resist layer.

The method for fabricating a thin film transistor according to the embodiment of the disclosure will be described below in details in connection with a particular embodiment thereof, where the thin film transistor is structured with a bottom gate, for example.

Figure 3A:
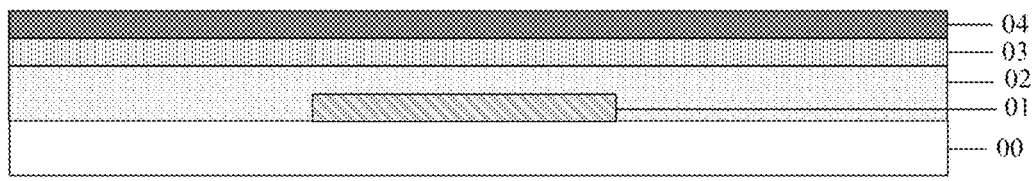
FIG. 3A to FIG. 3H are schematic structural diagrams respectively after respective steps in the method for fabricating a thin film transistor according to an embodiment of the disclosure are performed.
Figure 3B:
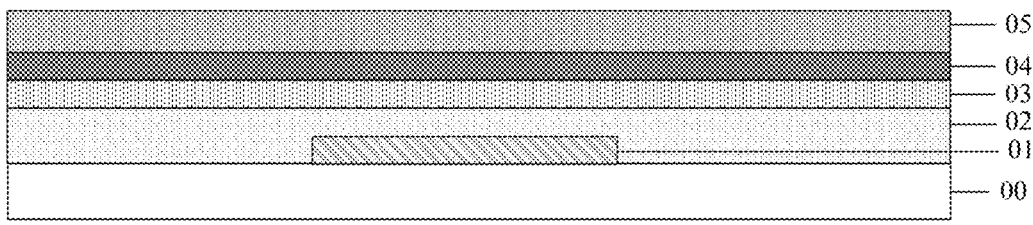
Figure 3C:
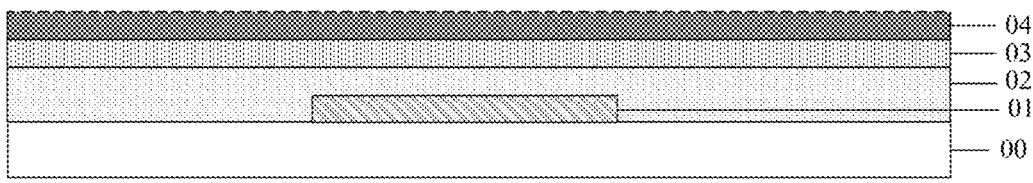
Figure 3D:
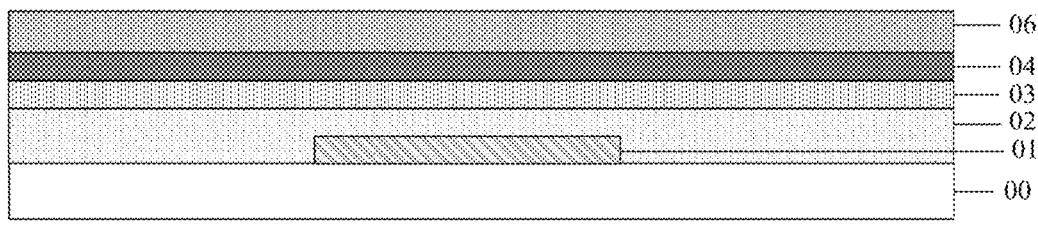
Figure 3E:
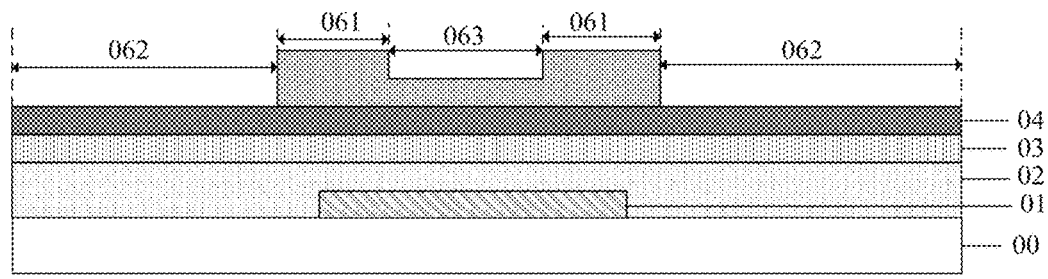
Figure 3F:
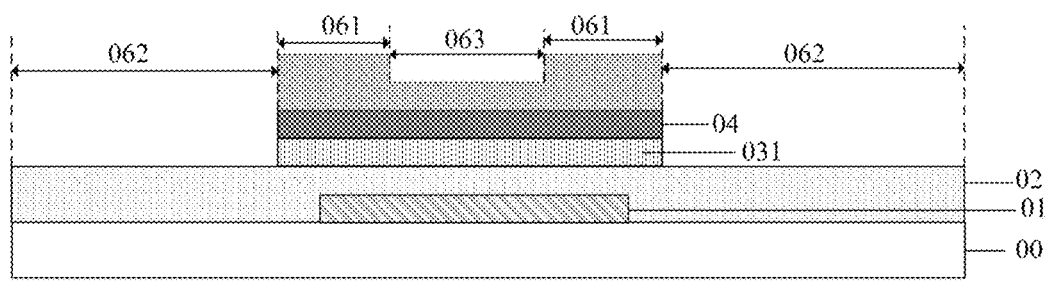
Figure 3G:
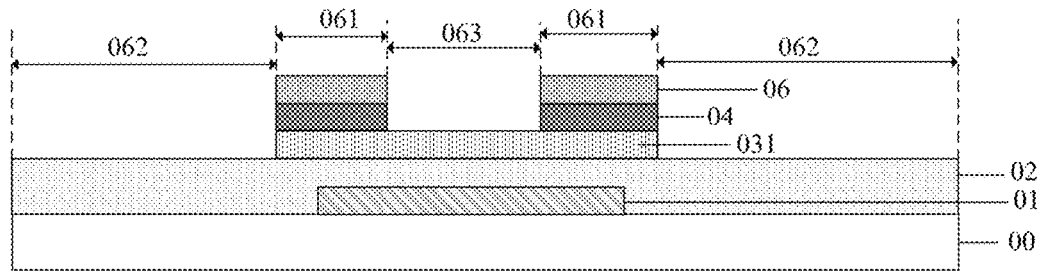
Figure 3H:
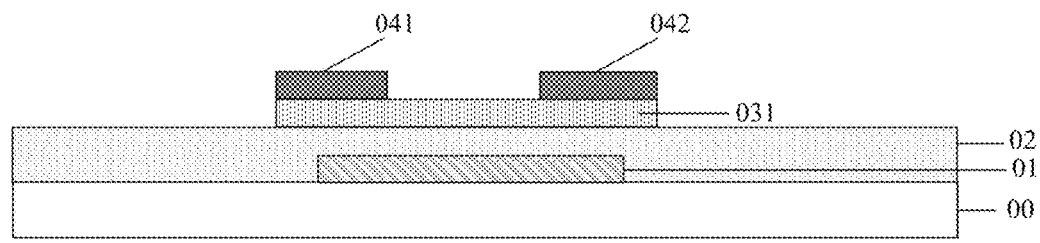

The first step is to form patterns of the gate 01 and a gate insulation layer 02, an oxide semiconductor layer 03, and a source-drain metal layer 04 on the oxide semiconductor layer 03, on an underlying substrate 00 in that order, as illustrated in FIG. 3A;

The second step is to form a first photo-resist layer 05 on the surface of the source-drain metal layer 04, as illustrated in FIG. 3B;

The third step is to pre-bake, expose, develop, and post-bake the first photo-resist layer 05, and then strip the first photo-resist layer 05 to rough the surface of the source-drain metal layer, as illustrated in FIG. 3C;

The fourth step is to coat the roughened surface of the source-drain metal layer with a second photo-resist layer 06, as illustrated in FIG. 3D;

The fifth step is to expose and develop the second photo-resist layer 06 to form an area 061 where all the second photo-resist is reserved, an area 062 where all the second photo-resist is removed, and an area 063 where a part of the second photo-resist is reserved, where the area 063 where a part of the second photo-resist is reserved corresponds to a channel area, and the area 061 where all the second photo-resist is reserved corresponds to patterns of source and drain electrodes to be formed, as illustrated in FIG. 3E;

The sixth step is to post-bake the second photo-resist layer 06 at temperature ranging from 110° C. to 150° C.;

The seventh step is to etch the source-drain metal layer and the oxide semiconductor layer corresponding to the area 062 where all the second photo-resist is removed, to form a pattern of the active layer 031, as illustrated in FIG. 3F;

The eighth step is to post-bake the second photo-resist layer 06 at temperature ranging from 110° C. to 150° C.;

The ninth step is to ash the second photo-resist layer 06 to remove all the photo-resist layer in the area 063 where a part of the second photo-resist is reserved, and to etch the source-drain metal layer 04 corresponding to the area 063 where a part of the second photo-resist is reserved, to form patterns of a source electrode 041 and a drain electrode 042, as illustrated in FIG. 3G; and The tenth step is to strip the second photo-resist layer, as illustrated in FIG. 3H.

A patterning process needs to be performed when forming the structures of the respective film layers in the thin film transistor formed in the steps above. The patterning process may include only a photolithography process or may include a photolithography process and an etching step, and also other processes for forming a predetermined pattern, such as printing and ink-jetting; and the photolithography process refers to a process, including film formation, exposure, development, etc., for forming a pattern using photo-resist, a mask, an exposure machine, etc. In a particular implementation, the corresponding patterning process can be selected for the structure to be formed in the embodiment of the disclosure.

Based upon the same inventive idea, an embodiment of the disclosure further provides a thin film transistor which is a thin film transistor fabricated using the method for fabricating a thin film transistor according to any one of the embodiments above of the disclosure.

Figure 4:
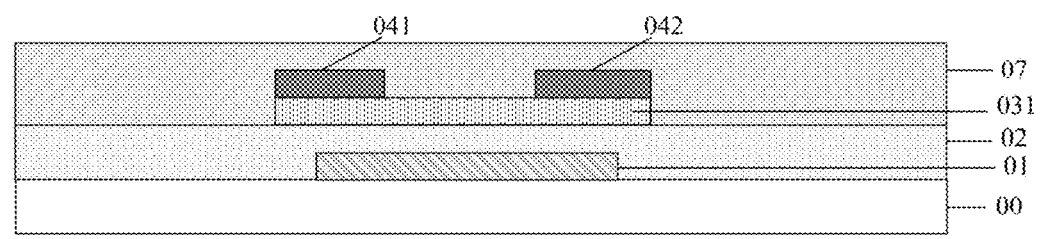
FIG. 4 is a schematic structural diagram of a thin film transistor according to an embodiment of the disclosure.

Particularly referring to FIG. 4, an embodiment of the disclosure provides a thin film transistor including an underlying substrate 00, and a gate 01, a gate insulation layer 02, and an active layer 031 stacked above the underlying substrate 00; and also a source electrode 041 and a drain electrode 042 located above and electrically connected with the active layer 031, and an insulation layer 07 located above the source electrode 041 and the drain electrode 042.

It shall be noted that the thin film transistor according to the embodiment of the disclosure can also be fabricated using the method above for fabricating a thin film transistor. Reference can be made to the method above for fabricating a thin film transistor for an embodiment of the thin film transistor, so a repeated description thereof will be omitted here.

Figure 5:
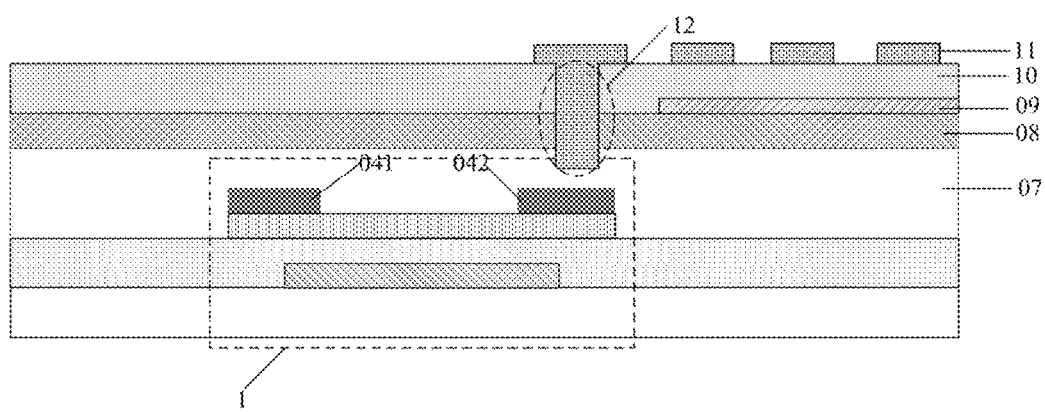
FIG. 5 is a schematic structural diagram of an array substrate according to an embodiment of the disclosure.

Based upon the same inventive idea, referring to FIG. 5, an embodiment of the disclosure further provides an array substrate including a plurality of the thin film transistors 1 according to the embodiment above of the disclosure.

Where the thin film transistors in the array substrate are structured as the thin film transistor as illustrated in FIG. 3.

In a particular embodiment, referring to FIG. 5, the array substrate above according to the embodiment of the disclosure further includes: a flat layer 08, a common electrode layer 09, a passivation layer 10, and a pixel electrode layer 11, stacked above the insulation layer 07, where the passivation layer 10 includes a via hole 12 running through the passivation layer, the flat layer, and the insulation layer to connect a pixel electrode and a drain electrode.

Here the via hole 12 can be formed in shape as a result of etching once after the passivation layer is formed, thereby further reducing the number of masks, and simplify the masks.

Particularly the array substrate above according to the embodiment of the disclosure can be applicable to a liquid crystal display panel, and also an organic electroluminescent display panel, although the embodiment of the disclosure will not be limited thereto.

If the array substrate above is applied to a liquid crystal display panel, then a pixel electrode may refer to a pixel electrode in the liquid crystal display panel, and if the array substrate above is applied to an organic electroluminescent display panel, then a pixel electrode may refer to a cathode layer or an anode layer in an organic electroluminescent pixel structure.

In summary, a method for roughening the surface of a metal layer according to an embodiment of the disclosure includes: forming a first photo-resist layer on the surface of the metal layer, and processing the first photo-resist layer at high temperature; and stripping the first photo-resist layer to roughen the surface of the metal layer. In the embodiment of the disclosure, the photo-resist layer is processed at high temperature so that the roughness of the surface of the metal layer will be improved while the photo-resist layer is being striped, thus improving the adhesion to the surface of the metal layer in subsequent patterning on the surface of the metal layer. Furthermore a method for fabricating a thin film transistor according to an embodiment of the disclosure includes: forming an oxide semiconductor layer and a source-drain metal layer on an underlying substrate; roughening the surface of the source-drain metal layer; and performing a patterning process on the roughened source-drain metal layer, and the oxide semiconductor layer to form patterns of source and drain electrodes, and a pattern of an active layer. Accordingly in the embodiment of the disclosure, after the surface of the source-drain metal layer is roughened, the adhesion to the surface of the source-drain metal layer is improved, and then the source-drain metal layer is patterned using the patterning process through coating it with the photo-resist, thus avoiding the photo-resist from peeling off.

Evidently those skilled in the art can make various modifications and variations to the disclosure without departing from the spirit and scope of the disclosure. Accordingly the disclosure is also intended to encompass these modifications and variations thereto so long as the modifications and variations come into the scope of the claims appended to the disclosure and their equivalents.

The invention claimed is:

1. A method for fabricating a thin film transistor, the method comprising:

forming an oxide semiconductor layer and a source-drain metal layer on an underlying substrate;

forming a first photo-resist layer on a surface of the source-drain metal layer, and processing the first photo-resist layer by pre-baking, exposing, developing, and post-baking the first photo-resist layer, wherein the post-baking is at a temperature ranging from 110° C. to 150° C.; and stripping the first photo-resist layer to roughen the surface of the source-drain metal layer; and performing a patterning process on the roughened source-drain metal layer, and the oxide semiconductor layer to form patterns of source and drain electrodes, and a pattern of an active layer;

wherein performing the patterning process on the roughened source-drain metal layer, and the oxide semiconductor layer to form the patterns of the source and drain electrodes, and the pattern of the active layer comprises:

forming a second photo-resist layer on the roughened source-drain metal layer;

exposing and developing the second photo-resist layer to form an area where all the second photo-resist is reserved, an area where all the second photo-resist is removed, and an area where a part of the second photo-resist is reserved, wherein the area where a part of the second photo-resist is reserved corresponds to a channel area, and the area where all the second photo-resist is reserved corresponds to the patterns of the source and drain electrodes to be formed;

in the area where all the second photo-resist is removed, etching the roughened source-drain metal layer and the oxide semiconductor layer to form the pattern of the active layer;

ashing the second photo-resist layer to remove all of the second photo-resist layer located in the area where a part of the second photo-resist was reserved; and subsequently etching in the area where the part of the second photo-resist was reserved to remove the roughened source-drain metal layer to form the patterns of the source and drain electrodes;

wherein after etching the roughened source-drain metal layer and the oxide semiconductor layer to form the pattern of the active layer, the method further comprises:

over-etching the roughened source-drain metal layer and the oxide semiconductor layer for a period of time which is 5% to 20% of a length of time of etching the roughened source-drain metal layer and the oxide semiconductor layer.

2. The method according to claim 1, wherein after exposing and developing the second photo-resist layer, and before etching the roughened source-drain metal layer and the oxide semiconductor layer to form the pattern of the active layer, the method further comprises:

post-baking the second photo-resist layer.

3. The method according to claim 1, wherein after ashing the second photo-resist layer to remove all of the second photo-resist layer located in the area where the part of the second photo-resist was reserved, and before subsequently etching in the area where the part of the second photo-resist was reserved to remove the roughened source-drain metal layer, the method further comprises:

post-baking the second photo-resist layer.

4. The method according to claim 1, wherein after etching in the area where the part of the second photo-resist was reserved to remove the roughened source-drain metal layer to form the patterns of the source and drain electrodes, the method further comprises: over etching in the area where the part of the second photo-resist was reserved for a period of time which is 0% to 20% of a length of time of etching in the area where the part of the second photo-resist was reserved to remove the roughened source-drain metal layer.

5. A thin film transistor, comprising a thin film transistor fabricated using the method for fabricating a thin film transistor according to claim 1.

6. An array substrate, comprising the thin film transistor according to claim 5.

* * * * *